United States Patent
Yugawa

(10) Patent No.: US 8,513,535 B2
(45) Date of Patent: Aug. 20, 2013

(54) CIRCUIT BOARD AND STRUCTURE USING THE SAME

(75) Inventor: Hidetoshi Yugawa, Shiga (JP)

(73) Assignee: Kyocera Corporation, Kyoto (JP)

( * ) Notice: Subject to any disclaimer, the term of this patent is extended or adjusted under 35 U.S.C. 154(b) by 338 days.

(21) Appl. No.: 12/609,989

(22) Filed: Oct. 30, 2009

(65) Prior Publication Data

US 2011/0100691 A1 May 5, 2011

(51) Int. Cl.
*H05K 1/16* (2006.01)

(52) U.S. Cl.
USPC .......................................... 174/260; 174/250

(58) Field of Classification Search
USPC ................ 174/260, 250; 257/750, 751, 757, 257/717; 438/656, 643
See application file for complete search history.

(56) References Cited

U.S. PATENT DOCUMENTS

| | | | | |
|---|---|---|---|---|
| 6,190,493 B1 * | 2/2001 | Watanabe et al. | ............. | 156/300 |
| 6,339,020 B1 * | 1/2002 | Weihs et al. | .................. | 438/643 |
| 7,038,318 B2 * | 5/2006 | Iyer et al. | ...................... | 257/768 |
| 7,419,903 B2 * | 9/2008 | Haukka et al. | ................ | 438/627 |
| 2009/0315093 A1 * | 12/2009 | Li et al. | ......................... | 257/314 |

FOREIGN PATENT DOCUMENTS

JP  09-023065  1/1997

* cited by examiner

*Primary Examiner* — Yuriy Semenenko
(74) *Attorney, Agent, or Firm* — DLA Piper LLP (US)

(57) ABSTRACT

A circuit board includes an insulating layer and a conductive layer formed on the insulating layer. The insulating layer contains a resin with high heat resistance. The conductive layer includes a metal carbide layer bonded to the insulating layer and containing a carbide of a first metal in group IV, V, or VI of the periodic table, and a first metal layer bonded to the metal carbide layer and containing the first metal.

6 Claims, 17 Drawing Sheets

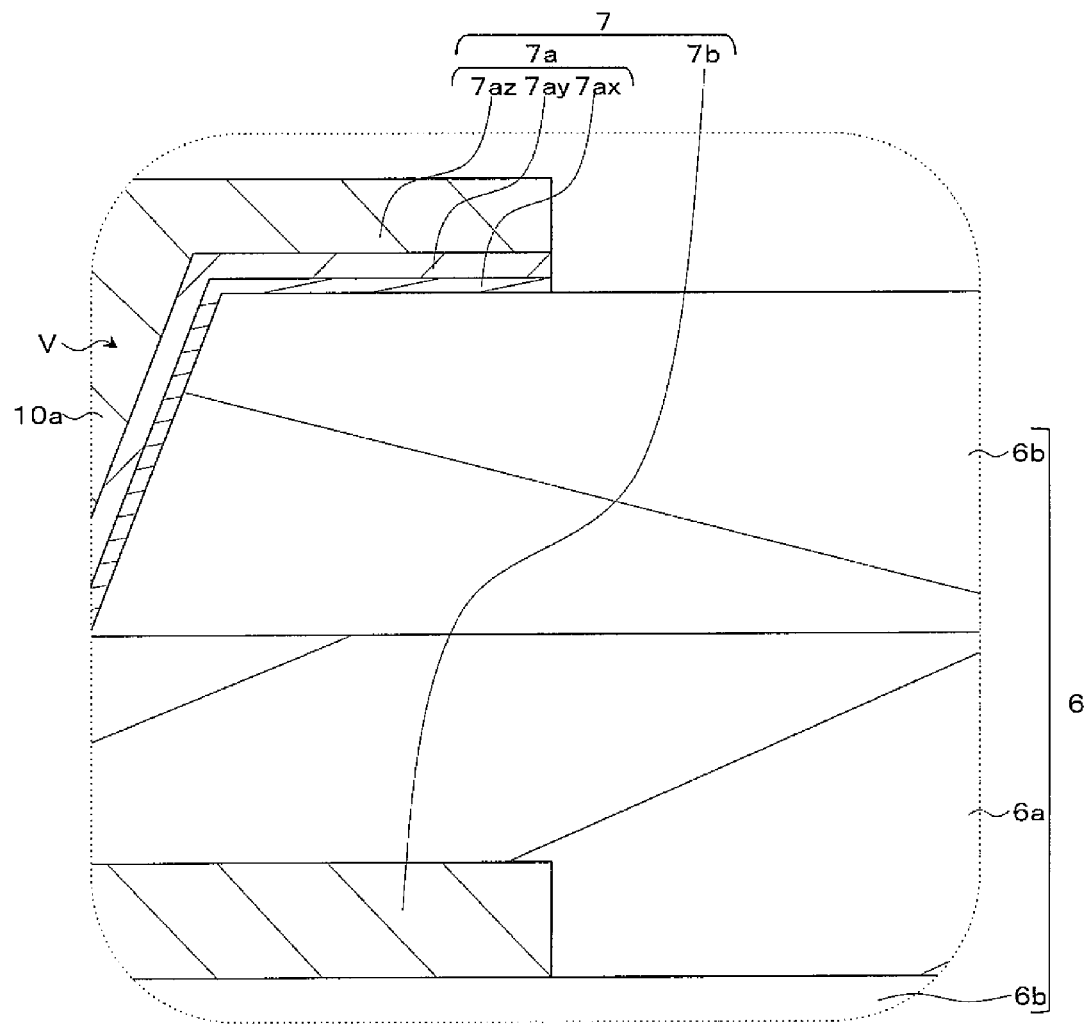

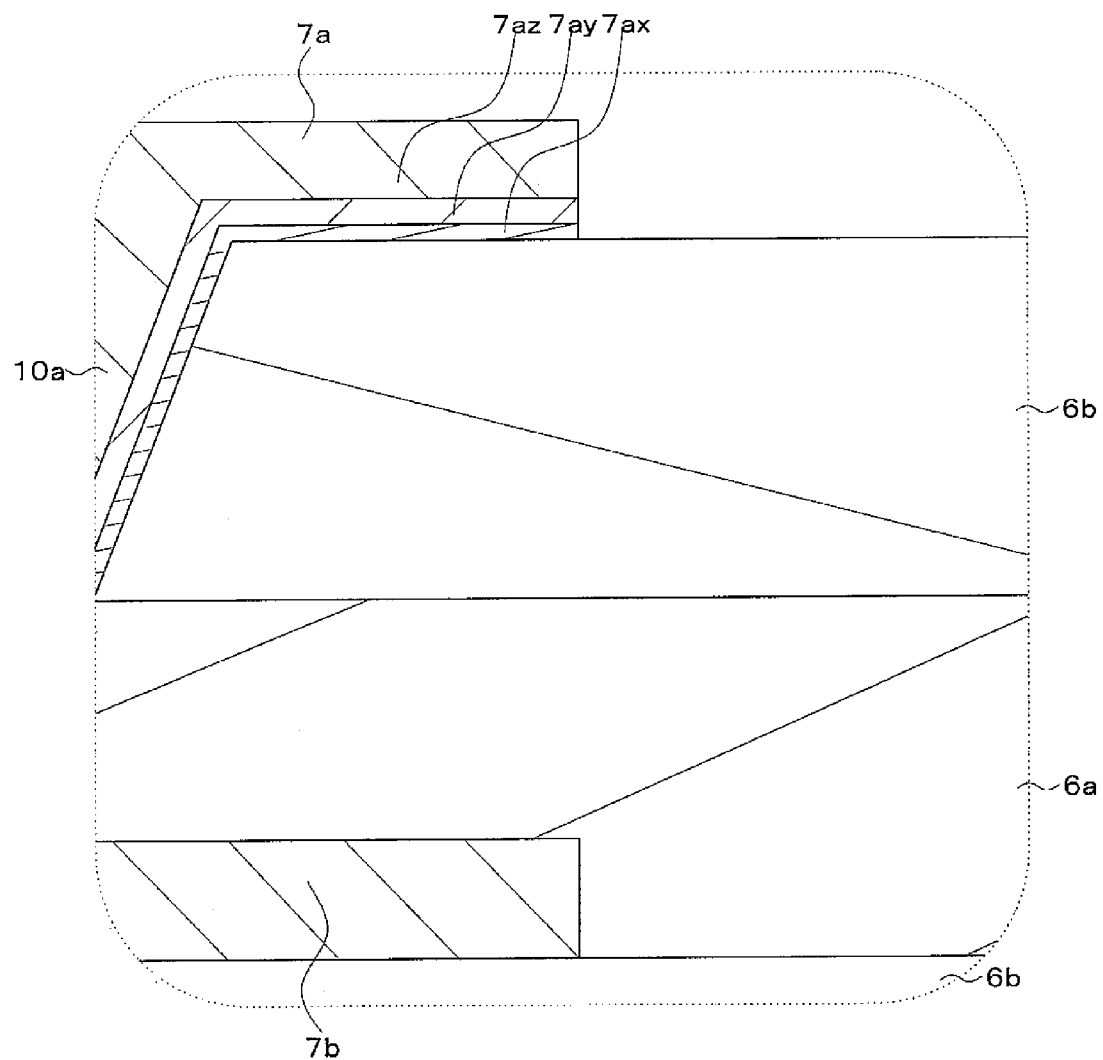

CIRCUIT BOARD AND STRUCTURE USING THE SAME

BACKGROUND OF THE INVENTION

1. Field of the Invention

The present invention relates to circuit boards used in electronic apparatuses and to mounting structures including the circuit board which electronic components such as various audio visual apparatuses, electric household appliances, communication devices, computer apparatuses and peripheral devices thereof are mounted on or embedded in.

2. Description of the Related Art

Circuit boards which electronic components are mounted on or embedded in have been known. Such electronic components include semiconductor elements, capacitors, and the like. The semiconductor elements include IC (integrated circuit), LSI (large scale integration), and the like.

Japanese Unexamined Patent Application Publication No. 9-23065 discloses a circuit board including an insulating layer containing a resin and a conductive layer formed on the insulating layer and containing a metal.

An electronic component and a circuit board have different coefficients of thermal expansion. Therefore, for example, when heat is applied to the circuit board due to heating in solder ref lowing for mounting an electronic component or heat generated by an electronic component, a difference in the amount of thermal expansion occurs between the electronic component and the circuit board. Consequently, heat stress is applied between the insulating layer and the conductive layer, thereby separating between the insulating layer and the conductive layer and decreasing the reliability of the circuit board.

SUMMARY OF THE INVENTION

An object of the invention is to provide a circuit board and a mounting structure using the circuit board which meets a need for a strong adhesion between an insulating layer and a conductive layer.

According to one embodiment of the invention, a circuit board comprises an insulating layer comprising a resin, and a conductive layer disposed over the insulating layer. The conductive layer comprises a metal carbide layer which is in contact with the insulating layer. The metal carbide layer comprises a metal carbide including a carbon and a first metal selected from the group consisting of a group IV metal, a group V metal, a group VI metal and mixtures thereof. The conductive layer further includes the first metal layer in contact with the metal carbide layer.

In a circuit board and a mounting structure according to an embodiment of the present invention, adhesion between an insulating layer and a conductive layer can be enhanced. As a result, separation between the insulating layer and the conductive layer can be decreased, and thus a circuit board and a mounting structure having excellent reliability can be achieved.

BRIEF DESCRIPTION OF THE DRAWINGS

FIG. 2 is an enlarged view of portion X1 of the mounting structure shown in FIG. 1;

FIG. 13 is an enlarged view illustrating a step for manufacturing the mounting structure in the portion X1 of the mounting structure shown in FIG. 1;

DETAILED DESCRIPTION OF THE EXEMPLARY EMBODIMENTS

In the following description of exemplary embodiments, reference is made to the accompanying drawings which form a part hereof, and in which it is shown by way of example specific embodiments in which the invention may be practiced. It is to be understood that other embodiments may be utilized and structural changes may be made without departing from the scope of the present invention.

Figure 1:
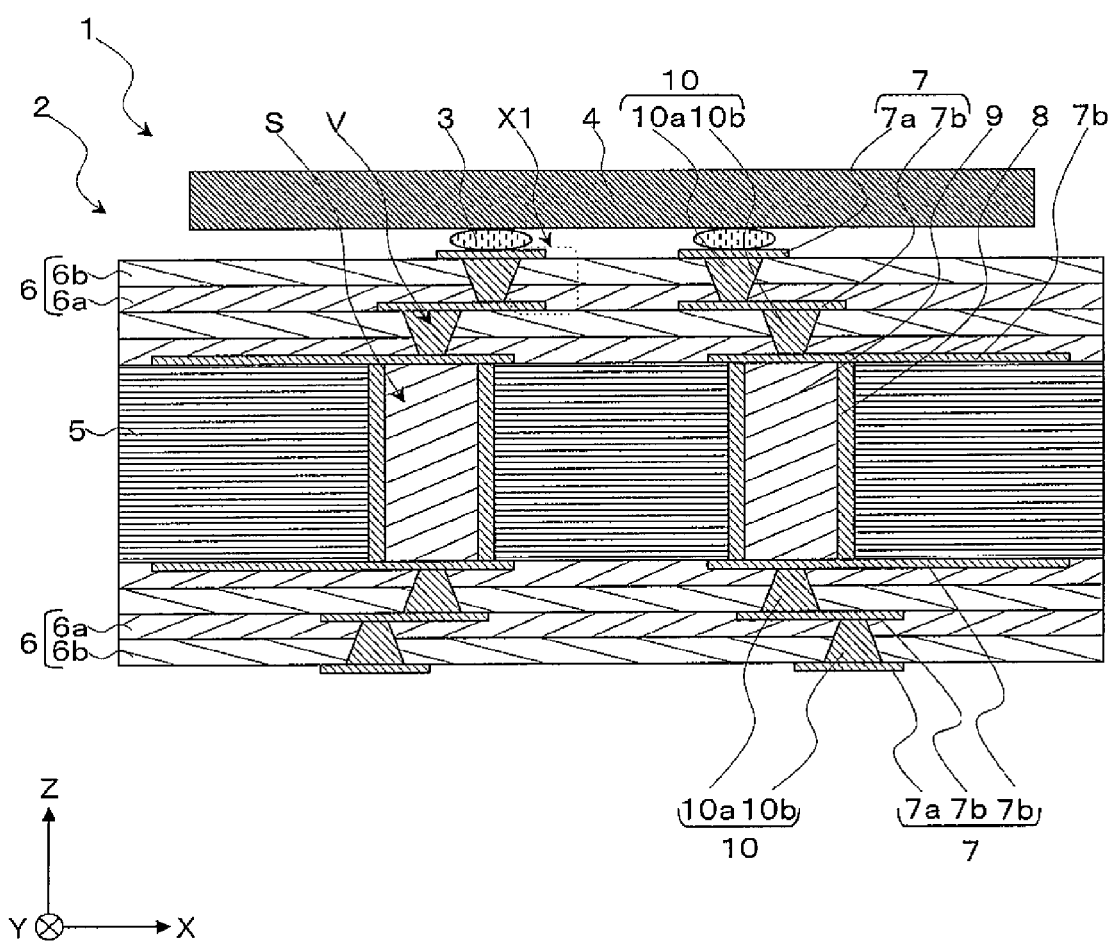
FIG. 1 is a sectional view of a mounting structure according to an embodiment of the present invention.

As shown in FIG. 1, a mounting structure 1 includes a circuit board 2 and an electronic component 4 flip-chip mounted on the upper surface of the circuit board 2 through bumps 3.

The circuit board 2 includes a substrate 5, a plurality of insulating layers 6 laminated on the upper and lower surfaces of the substrate 5, and a plurality of conductive layers 7 disposed on the upper and lower surfaces of the insulating layers 6.

The substrate 5 includes, for example, a thermosetting resin and a base in a thermosetting resin. As the base, for example, a woven fabric formed by weaving lengthwise and widthwise fibers made of glass, polyparaphenylene benzbisoxazole resin, wholly aromatic polyamide resin, or the like can be used. As the thermosetting resin, for example, an epoxy resin, a bismaleimide triazine resin, a cyanate resin, or the like can be used. The substrate 5 may have a structure which does not include the base. An exemplary structure having no base is a structure composed of a low-thermal-expansion resin. If a low-thermal-expansion resin is used for the substrate 5, an amount of thermal expansion of the substrate 5 can be decreased to be close to an amount of thermal expansion of the electronic component 4, whereby a fracture of the electronic component 4 is less likely to occur. Examples of the low-thermal-expansion resin include poly-paraphenylene benzbisoxazole resins, wholly aromatic polyamide resins, wholly aromatic polyester resins, polyimide resins, liquid crystal polymer resins, and the like. A coefficient of thermal expansion represents a coefficient of linear expansion measured by a test method according to ISO 11359-2: 1999.

Also, the substrate 5 has through holes S formed therein to penetrate the substrate 5 in the vertical direction (Z direction). A through hole conductor 8 is formed on the inner wall of each of the through holes S. The through hole conductor 8 electrically connects the conductive layers 7 formed on the upper and lower surfaces of the substrate 5. The through hole conductor 8 is composed of a conductive material. Examples of the conductive material include copper, silver, nickel, chromium, and the like. In this embodiment, the through hole conductor 8 is formed in a cylindrical shape which is filled with an insulator 9 in order to secure flatness of the substrate 5. The insulator 9 may include resin materials, fillers, elastomers, a flame retardant, a curing agent, and the like. As a resin material, for example, an epoxy resin, a cyanate resin, or the like is used. If the through hole S is filled with the through hole conductor 8, the insulator 9 is not necessary in the through hole conductor 8.

Each of the insulating layers 6 includes an adhesive layer 6a and a resin layer 6b.

The adhesive layer 6a bonds the resin layers 6b together or bonds the resin layer 6b and the substrate 5. The adhesive layer 6a contains a thermosetting resin or a thermoplastic resin. As the thermosetting resin, for example, a polyimide resin, an acrylic resin, an epoxy resin, a urethane resin, a cyanate resin, a silicone resin, a bismaleimide triazine resin, or the like may be used. As the thermoplastic resin, for example, a liquid crystal polymer or the like may be used. The coefficient of linear expansion of the adhesive layer 6a is preferably set to be, for example, from 15 ppm/° C. to 80 ppm/° C. In addition, the thickness of the adhesive layer 6a is preferably set to be, for example, from 2 μm to 20 μm.

The resin layer 6b preferably does not include a base but contains a resin with high heat resistance. The resin with high heat resistance does not have a clear glass transition temperature or melting point but has a high thermal decomposition temperature. The thermal decomposition temperature of the resin is preferably set to 350° C. or more, more preferably 400° C. or more. As a result, softening and deterioration of the resin can be decreased when heat is applied to the circuit board 2. As the resin having such properties, for example, a polyimide resin, a polybenzoxazole resin, or a polyimidobenzoxazole resin may be used. Among these materials, a polyimidobenzoxazole resin is preferably used. The polyimidobenzoxazole resin has a thermal expansion coefficient of as small as 5 ppm/° C. or less. As a result, a difference in an amount of thermal expansion between the circuit board 2 and the electronic component 4 can be decreased, and the stress applied to the conductive layers 7 is decreased. The thickness of the resin layer 6b is preferably set to be, for example, from 2 μm to 20 μm. A thermal decomposition temperature is a temperature at which the mass of a resin is decreased by 5% in thermogravimetric measurement according to ISO 11358: 1997.

The insulating layers 6 have via holes V forted therein, and a via conductor 10 is formed in each of the via holes V. The via conductors 10 electrically connect the conductive layers 7 formed on the upper and lower surfaces of the insulating layers 6. The via conductors 10 are formed so that the sectional area in the planar direction of the circuit board 2 increases from the upper surface of the substrate 5 to the upper surface of the circuit board 2 or from the lower surface of the substrate 5 to the lower surface of the circuit board 2. The via conductors 10 are composed of a, conductive material. Examples of the conductive material include copper, silver, gold, aluminum, nickel, chromium, and the like. The coefficient of linear expansion of the via conductors 10 is preferably set to be, for example, from 2 ppm/° C. to 20 ppm/° C.

The conductive layers 7 are electrically connected to the electronic component 4 so as to have the function as signal lines which transmit electric signals supplied to or from the electronic component 4 and have the function as power supply lines which supply power to the electronic component 4. The conductive layers 7 are formed on the upper and lower surfaces of the substrate 5 and are electrically connected to the through hole conductors 8. The conductive layers 7 are also formed on the upper and lower surfaces of each of the insulating layers 6 and are electrically connected to the via conductors 10. The coefficient of linear expansion of the conductive layers 7 is preferably set to be, for example, from 2 ppm/° C. to 20 ppm/° C.

The electronic component 4 is electrically connected to the conductive layers 7 through the bumps 3. A conductive material is used as the bumps 3. Examples of the conductive material include copper, silver, zinc, tin, indium, bismuth, antimony, and the like. As the electronic component 4, a semiconductor element, a capacitor, or the like may be used. As the semiconductor element, for example, IC, LSI, or the like may be used. As a material for the semiconductor element, silicon, germanium, gallium arsenide, gallium arsenide phosphide, gallium nitride, silicon carbide, or the like may be used. The thickness dimension of the electronic component 4 is preferably, for example, 0.1 mm to 1 mm.

As shown in FIG. 2, the conductive layers 7 include first conductive layers 7a formed on the top insulating layer 6 and second conductive layers 7b formed on the other insulating layers 6.

Each of the first conductive layers 7a includes a metal carbide layer 7ax bonded to the resin layer 6b of the insulating layer 6, a first metal layer 7ay bonded to the metal carbide layer 7ax, and a second metal layer 7az bonded to the first metal layer 7ay.

The metal carbide layer 7ax contains a first metal carbide composed of a group IV, V, or VI metal in the periodic table. Examples of the group IV, V, or VI metal in the periodic table include titanium, vanadium, chromium, zirconium, niobium, tantalum, tungsten, molybdenum, and the like. Since the metal carbide layer 7ax contains the first metal carbide, it can be strongly bonded to the resin layer 6b. This is presumably due to the fact that the first metal chemically bonds to a part of the molecular chains of the resin contained in the resin layer 6 to form a first metal carbide. In addition, this is presumably due to the fact that as described above, the resin layers 6 contain a resin with high heat resistance, and thus softening and deterioration of the resin can be decreased when heat is applied to the circuit board 2, thereby decreasing the possibility of breaking of bonds between the first metal and part of the molecular chains of the resin.

The first metal may be contained as an alloy with another metal in the metal carbide layer 7*ax*. For example, when the first metal is chromium, chromium may be contained as a nickel-chromium alloy in the metal carbide layer 7*ax*. In this case, it is presumed that chromium contained in the nickel-chromium alloy forms a carbide. The content of the first metal carbide in the metal carbide layer 7*ax* is preferably set to be from 1% to 30%. The thickness of the metal carbide layer 7*ax* is preferably set to be from 2 nm to 50 nm.

The metal carbide layer 7*ax* can be confirmed by observing, with a transmission electron microscope, a section of the circuit board 2 taken along the vertical direction. In addition, the first metal carbide contained in the metal carbide layer 7*ax* can be confirmed by analysis of the first conductive layers 7*a* of the circuit board 2 using known Auger electron spectroscopy.

The first metal layer 7*ay* includes as a main component the same metal material as the first metal, i.e., the first metal contained in the metal carbide layer 7*ax*. Since the first metal layer 7*ay* has higher conductivity than the metal carbide layer 7*ax*, the thickness of the first metal layer 7*ay* is preferably larger than that of the metal carbide layer 7*ax*. In addition, since the first metal layer 7*ay* and the metal carbide layer 7*ax* contain the first metal which is the same metal material, the first metal contained in the first metal layer 7*ay* metallically bonds with the first metal carbide contained in the metal carbide layer 7*ax*, permitting strong bonding between the first metal layer 7*ay* and the metal carbide layer 7*ax*.

In a case that the metal carbide layer 7*ax* contains an alloy of the first metal with another metal as described above, the first metal layer 7*ay* preferably contains the alloy from the viewpoint of bonding strength. The content of the first metal in the first metal layer 7*ay* is preferably set to be from 70% to 99%. The thickness of the first metal layer 7*ay* is preferably set to be from 5 nm to 100 nm.

The second metal layer 7*az* contains a second metal different from the first metal. As the second metal, a metal with high conductivity is preferably used from the viewpoint of enhancing the conductivity of the whole of the first conductive layers 7*a*. The second metal preferably forms an intermetallic compound with the first metal. As a result, the second metal of the second metal layer 7*az* forms an intermetallic compound with the first metal of the first metal layer 7*ay*, and thus the second metal layer 7*az* and the first metal layer 7*ay* can be strongly bonded together.

As the second metal, copper, gold, silver, platinum, aluminum or the like may be used. When the first metal layer 7*ay* contains a nickel-chromium alloy, copper is preferably used as the second metal. The content of the second metal in the second metal layer 7*az* is preferably set to 99% or more. The thickness of the second metal layer 7*az* is preferably set to be from 50 nm to 30 μm. The thickness of the first metal layer 7*ay* is preferably set to be 0.1% to less than 100% of the thickness of the second metal layer 7*az*.

As described above, in the circuit board 1 according to this embodiment, the metal carbide layer 7*ax* and the resin layer 6*b* are strongly bonded, and thus the first conductive layers 7*a* and the insulating layer 6 can be strongly bonded. In addition, the first metal layer 7*b* with high conductivity is strongly bonded to the metal carbide layer 7*ax*, and thus conductivity of the first conductive layers 7 can be enhanced while maintaining adhesion between the first conductive layers 7*a* and the insulating layer 6.

The first conductive layers 7*a* are preferably formed on a top insulating layer 6 to enhance the adhesion between the first conductive layer 7*a* and the top insulating layer 6 because the top insulating layer 6 is relatively easy to receive stress applied by mounting the electronic component on the upper surface of the circuit board 2.

The second conductive layers 7*b* are formed on the other insulating layers 6. The second conductive layers 7*b* are preferably composed of a metal with higher conductivity than a conductivity of the first conductive layers 7*a*. As such a metal, copper, gold, silver, aluminum, or the like may be used. The thickness of the second conductive layers 7*b* may be set to be from 300 nm to 30 μm.

Like in the first conductive layers 7*a*, the via conductors 10 may include first via conductors 10*a* formed in the top insulating layer 6 and second via conductors 10*b* formed in the other insulating layers 6. Each of the first via conductors 10*a* includes a metal carbide layer 7*ax* bonded to the inner wall of the via hole V, a first metal layer 7*ay* bonded to the metal carbide layer 7*ax*, and a second metal layer 7*az* bonded to the first metal layer 7*ay*. As a result, the via conductor 10 can be strongly bonded to the inner wall of each of the via holes V. The second via conductors 10*b* are preferably easily formed and composed of a metal with high conductivity. As such a metal, copper, gold, silver, aluminum, or the like may be used.

Next, a method for manufacturing the mounting structure 1 including the circuit board 2 is described on the basis of FIGS. 3 to 14.

Figure 3A:
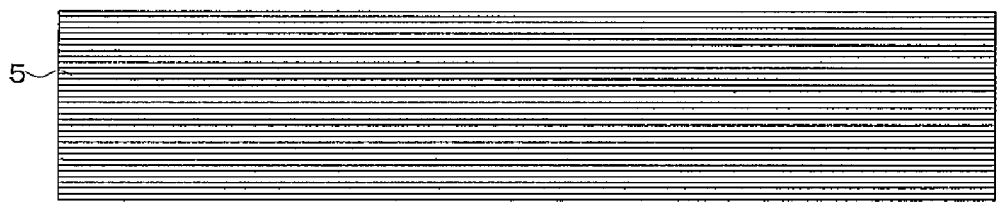
FIGS. 3A, 3B, and 3C are sectional views illustrating respective steps for manufacturing the mounting structure shown in FIG. 1.

(1) As shown in FIG. 3A, the substrate 5 is provided. Specifically, a plurality of resin sheets each including a base impregnated with a thermosetting resin is provided, and then the resin sheets are laminated and pressed under heating to form the substrate 5. The thickness of the substrate 5 is preferably set to be, for example, from 0.1 mm to 1.5 mm.

Figure 3B:
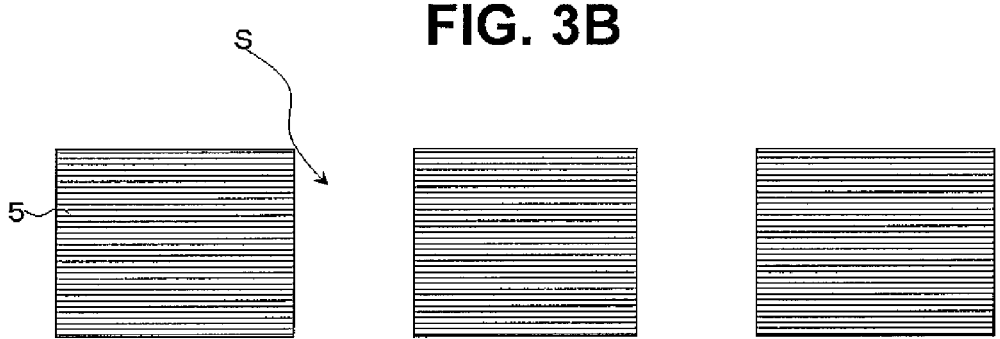

(2) As shown in FIG. 3B, the through holes S are formed in the substrate 5 to penetrate the substrate 5 in the vertical direction. The through holes S are formed by, for example, drilling, laser machining, or the like. The diameter of the through holes S is preferably set to be, for example, from 10 μm to 1 mm.

Figure 3C:
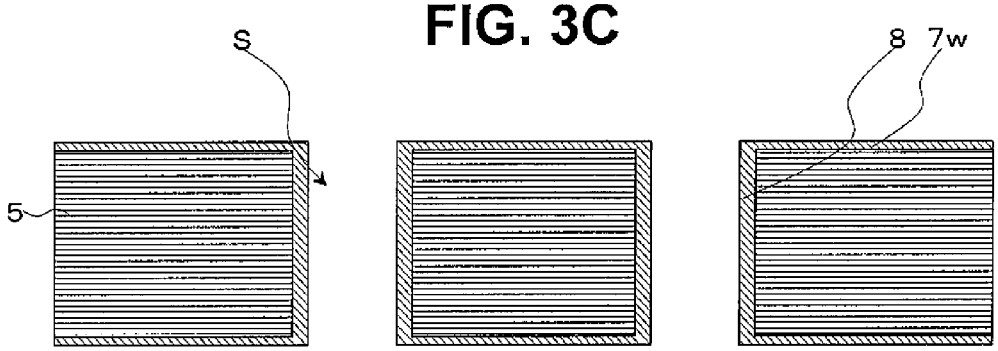

(3) As shown in FIG. 3C, a conductive material is deposited on the surfaces of the substrate 5 to form conductive material layers 7*w*. The conductive material layers 7*w* on the inner walls of the through holes S constitute the cylindrical through hole conductors 8. The conductive material layers 7*w* are formed by, for example, electroless plating.

Figure 4A:
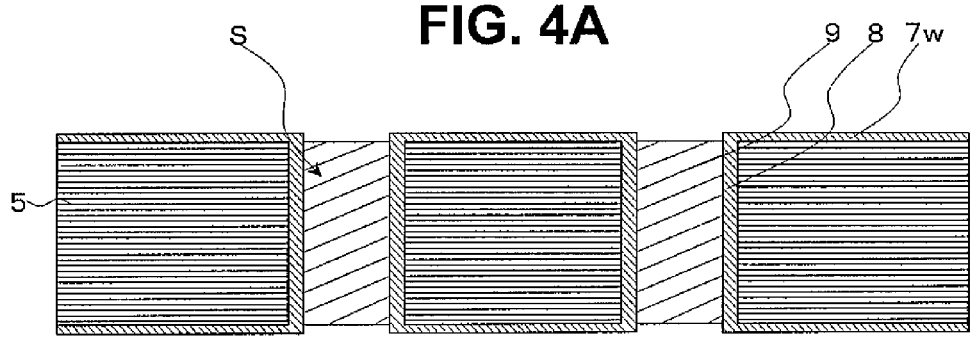
FIGS. 4A, 4B, and 4C are sectional views illustrating respective steps for manufacturing the mounting structure shown in FIG. 1.

(4) As shown in FIG. 4A, the inner spaces of the cylindrical through hole conductors 8 are filled with a resin material or the like to form the insulators 9.

Figure 4B:
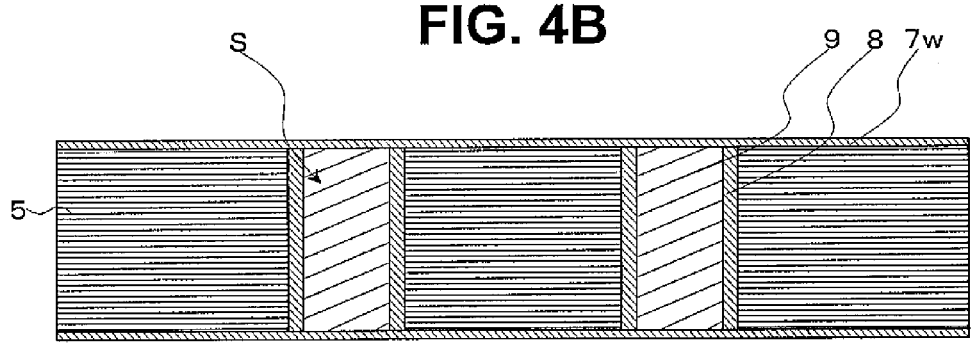

(5) As shown in FIG. 4B, a conductive material is deposited on the exposed portions of the insulators 9 to form the conductive material layers 7*w* on the exposed portions of the insulators 9. The conductive material is deposited by, for example, electroless plating.

Figure 4C:
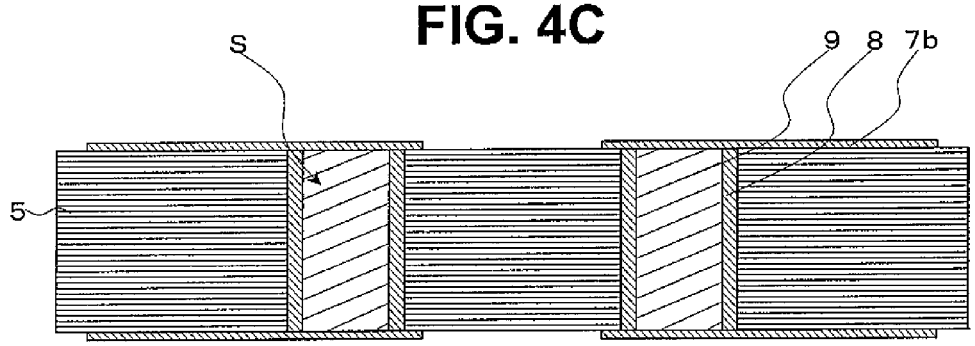

(6) As shown in FIG. 4C, the conductive material layers 7*w* are patterned to form the second conductive layers 7*b*. The conductive material layers 7*w* are patterned by a known photolithographic technique, etching, and the like.

Figure 5A:
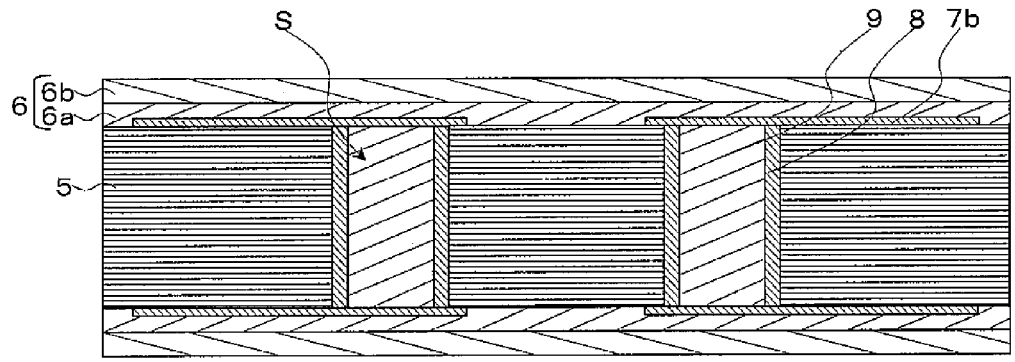
FIGS. 5A, 5B, and 5C are sectional views illustrating respective steps for manufacturing the mounting structure shown in FIG. 1.

(7) As shown in FIG. 5A, the resin layers 6*b* are bonded to the second conductive layers 7*b* through the adhesive layers 6*a* therebetween. The bonding is performed by hot pressing. The heat pressing is performed using, for example, a hot pressing machine. As described above, the insulating layers 6 each including the adhesive layer 6*a* and the resin layer 6*b* can be formed.

Figure 5B:
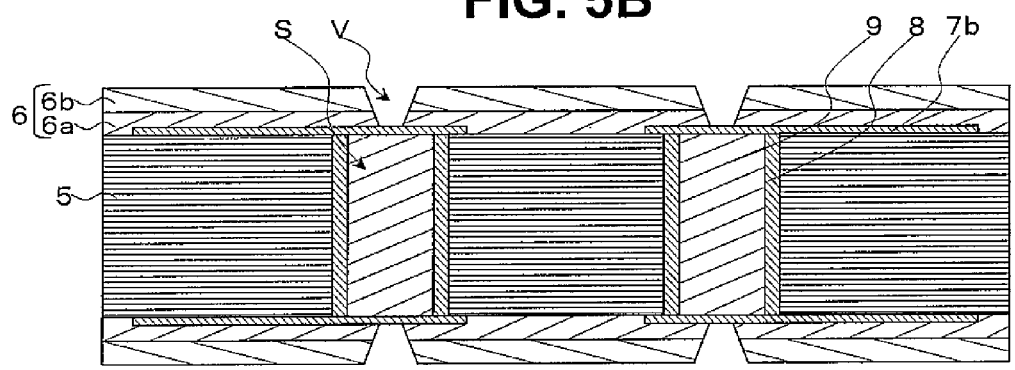

(8) As shown in FIG. 5B, the via holes V are formed in the insulating layers 6 to expose at least portions of the second conductive layers 7*b* in the via holes V. The via holes V are formed using, for example, a YAG laser device or a carbon dioxide gas laser device. The via holes V are formed by irradiation with laser beam in a direction perpendicular to the upper surfaces of the resin layers 6b. In addition, by adjusting the output of a laser beam, the via holes V can be formed so that the opening width decreases from the upper surface of each resin layer 6b to the upper surface of the substrate 5.

Figure 5C:
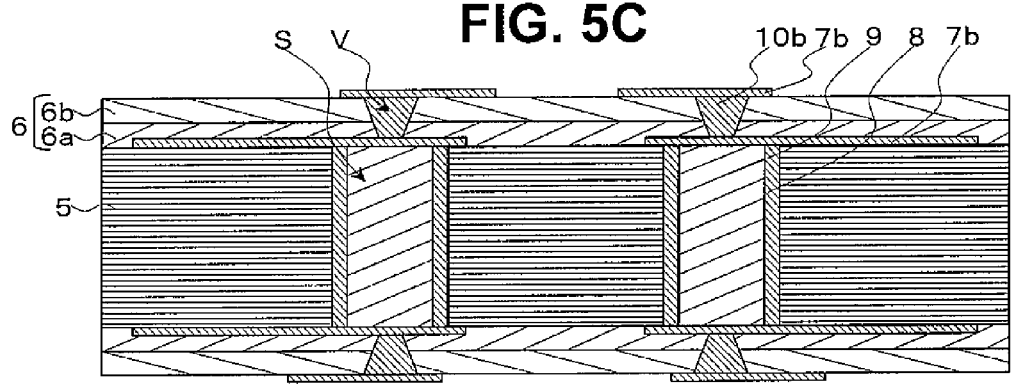

(9) As shown in FIG. 5C, the second via conductor 10b is formed in each of the via holes V, and the second conductive layers 7b are formed on the upper surfaces of the insulating layers 6. The second via conductors 10b and the second conductive layers 7b are formed by a semi-additive, subtractive, or full additive process using an electroless plating method or the like. In particular, the semi-additive process is preferred.

Figure 6A:
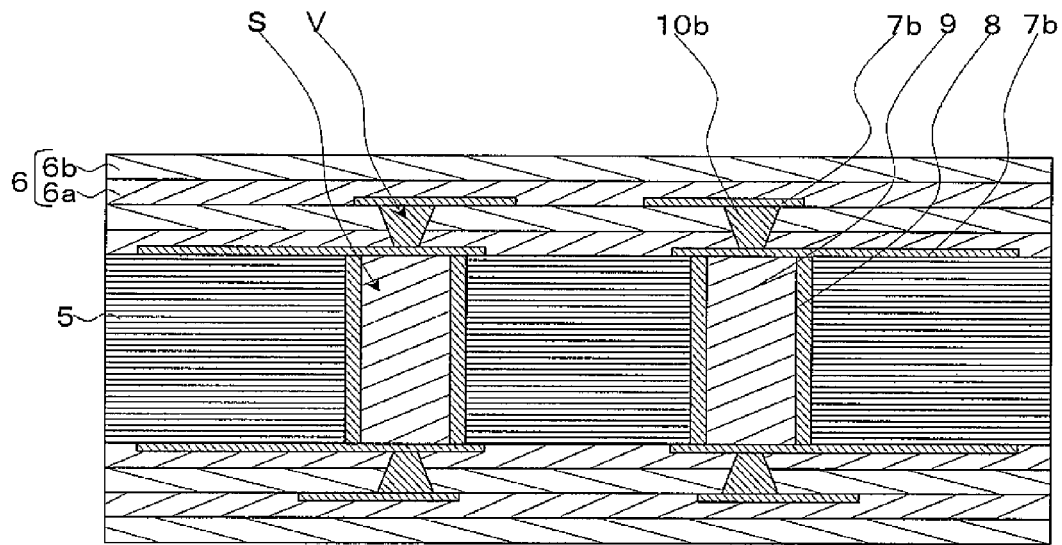
FIGS. 6A and 6B are sectional views illustrating respective steps for manufacturing the mounting structure shown in FIG. 1.

(10) As shown in FIG. 6A, the resin layers 6b are bonded to the second conductive layers 7 through the adhesive layers 6a to form the top insulating layers 6 in the circuit board 2. Bonding is performed by the same method as in the above-described step (7).

Figure 6B:
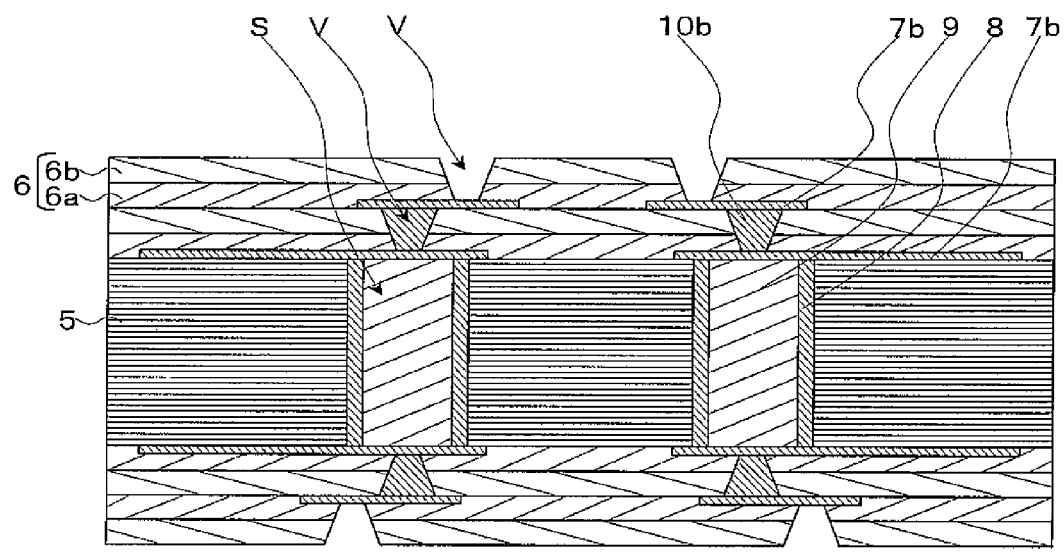

(11) As shown in FIG. 6B, the via holes V are formed in the insulating layers 6. The via holes V are formed by the same method as in the above-described step (8).

(12) A plasma treatment is performed on the surfaces of the resin layers 6b. The plasma is treated under an oxygen, nitrogen or argon atmosphere in a chamber. An exemplary period of plasma treatment is from 20 seconds to 1800 seconds. An exemplary pressure in the chamber where the circuit board 2 is set is from 0.01 Pa to 100 Pa. An exemplary electric power applied to electrodes of the chamber per unit area of the electrodes is from 0.05 W/cm$^2$ to 0.7 W/cm$^2$. An exemplary temperature in the chamber is from 20° C. to 40° C.

Figure 7:
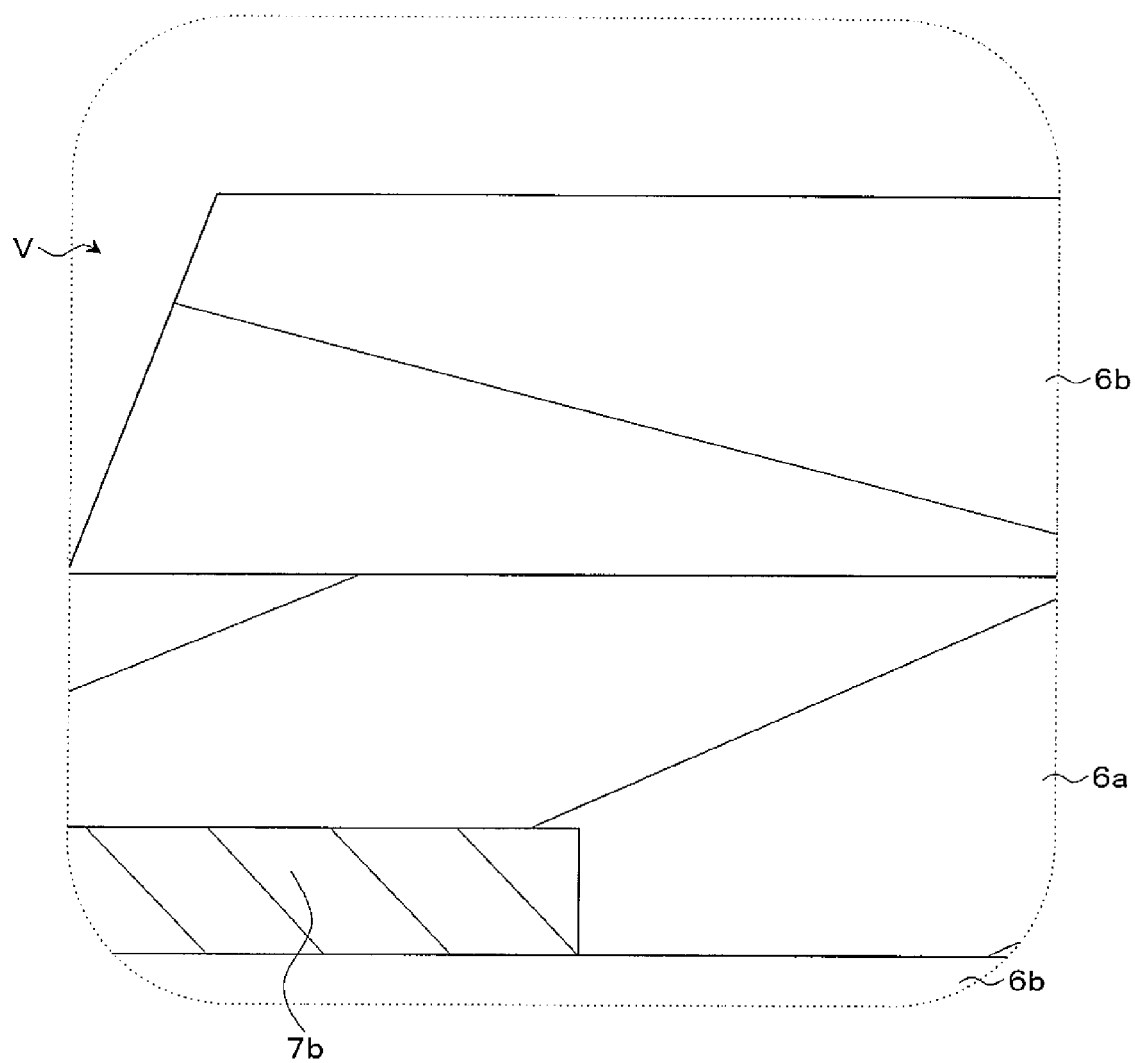
FIG. 7 is an enlarged view illustrating a step for manufacturing the mounting structure in the portion X1 of the mounting structure shown in FIG. 1.
Figure 8:
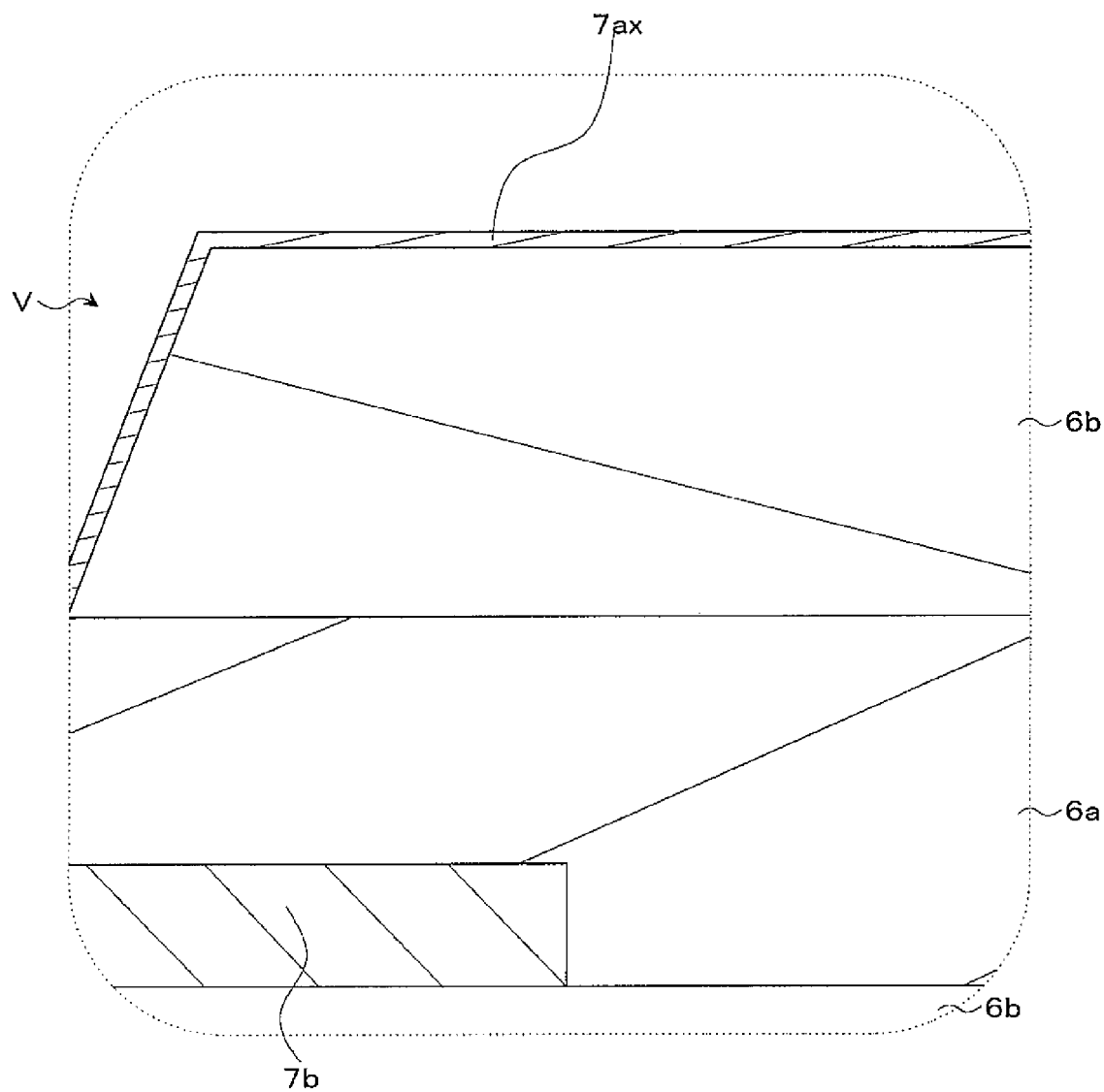
FIG. 8 is an enlarged view illustrating a step for manufacturing the mounting structure in the portion X1 of the mounting structure shown in FIG. 1.

(13) As shown in FIGS. 7 and 8, the first metal is formed on the surfaces of the resin layers 6b. The first metal is sputtered while the circuit board 2 is heated. In this step, molecular chain of resin contained in the resin layers 6 is partially cut by energy of heating and sputtering, and the first metal is bonded to the cut molecular chain of the resin to form the first metal carbide. As a result, the metal carbide layers 7ax can be formed.

The heating temperature of the circuit board 2 is preferably set to be lower than the thermal decomposition temperature of the resin contained in the resin layers 6. Consequently, thermal decomposition of the resin can be decreased, and reliability of the circuit board 2 can be maintained.

As the resin contained in the resin layers 6b, a resin with high heat resistance is preferably used. As a result, the high thermal decomposition temperature of the resin permits sputtering to be performed while heating the circuit board 2 to a higher temperature, and the metal carbide layers 7ax can be satisfactorily formed. For example, when a polyimidobenzoxazole resin is used as the resin contained in the resin layers 6b, the heating temperature of the circuit board 2 is preferably set to 110° C. to lower than 300° C. When the heating temperature of the circuit board 2 is set to 110° C. or higher, reaction between the first metal and the molecular chain of the resin promote the formation of the first metal carbide. When the heating temperature of the circuit board 2 is set to lower than 300° C., formation of free carbon due to thermal decomposition of the resin in the resin layers 6b is decreased. Therefore, adhesive force between the resin layers 6b and the metal carbide layers 7ax can be enhanced.

In addition, the sputtering output of the first metal is preferably set to 100 W to less than 2000 W. When the sputtering output of the first metal is set to 100 W or more, the deposition time of the first metal can be shortened. When the sputtering output of the first metal is set to less than 2000 W, deterioration of the resin can be decreased. The sputtering of the first metal is preferably performed under a vacuum condition. In this case, the degree of vacuum is preferably set to be from 0.1 Pa to 10 Pa.

Figure 9:
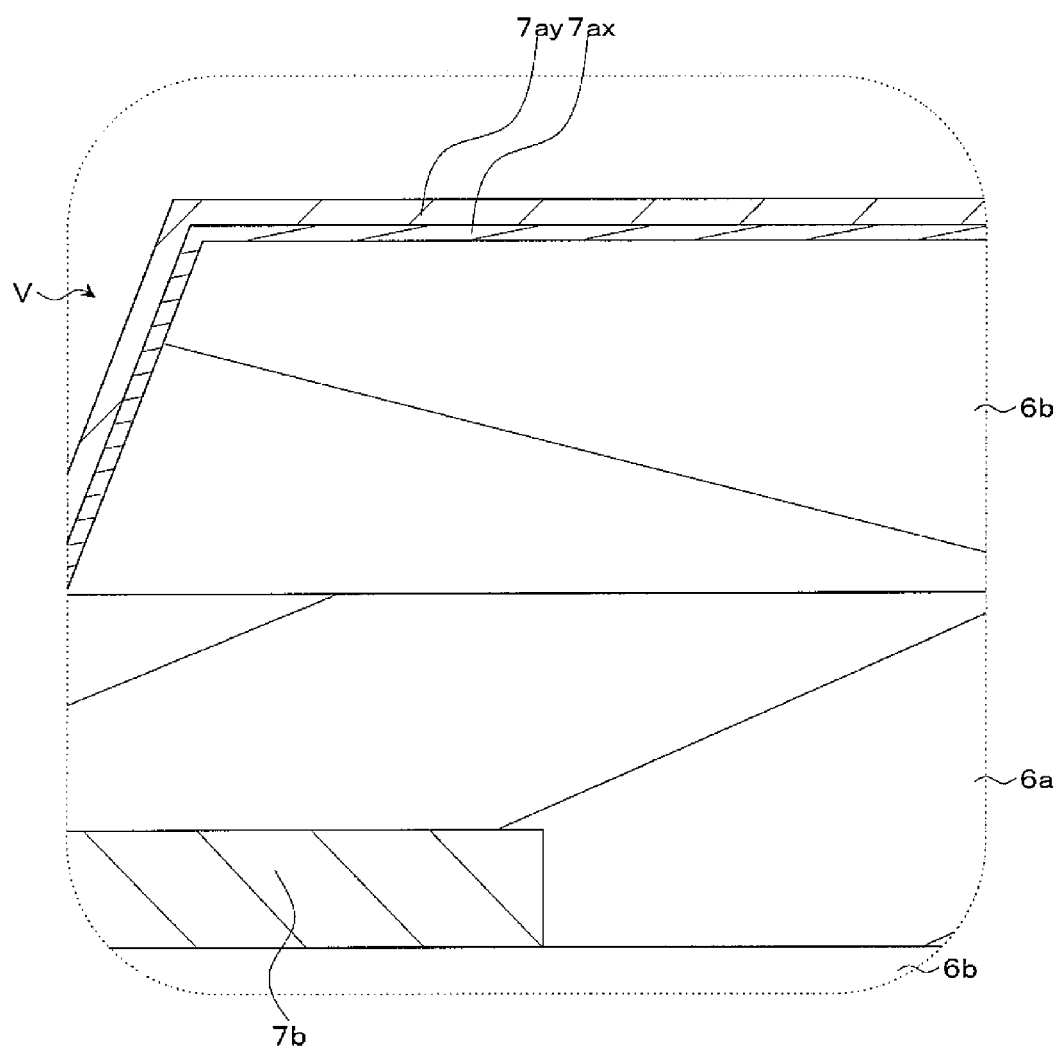
FIG. 9 is an enlarged view illustrating a step for manufacturing the mounting structure in the portion X1 of the mounting structure shown in FIG. 1.

(14) As shown in FIG. 9, sputtering in the step (13) is continued to form the first metal layers 7ay. In this step, the heating temperature of the circuit board 2 is preferably set to lower than 130° C. As a result, the first metal layers 7ay can be easily formed.

Figure 10:
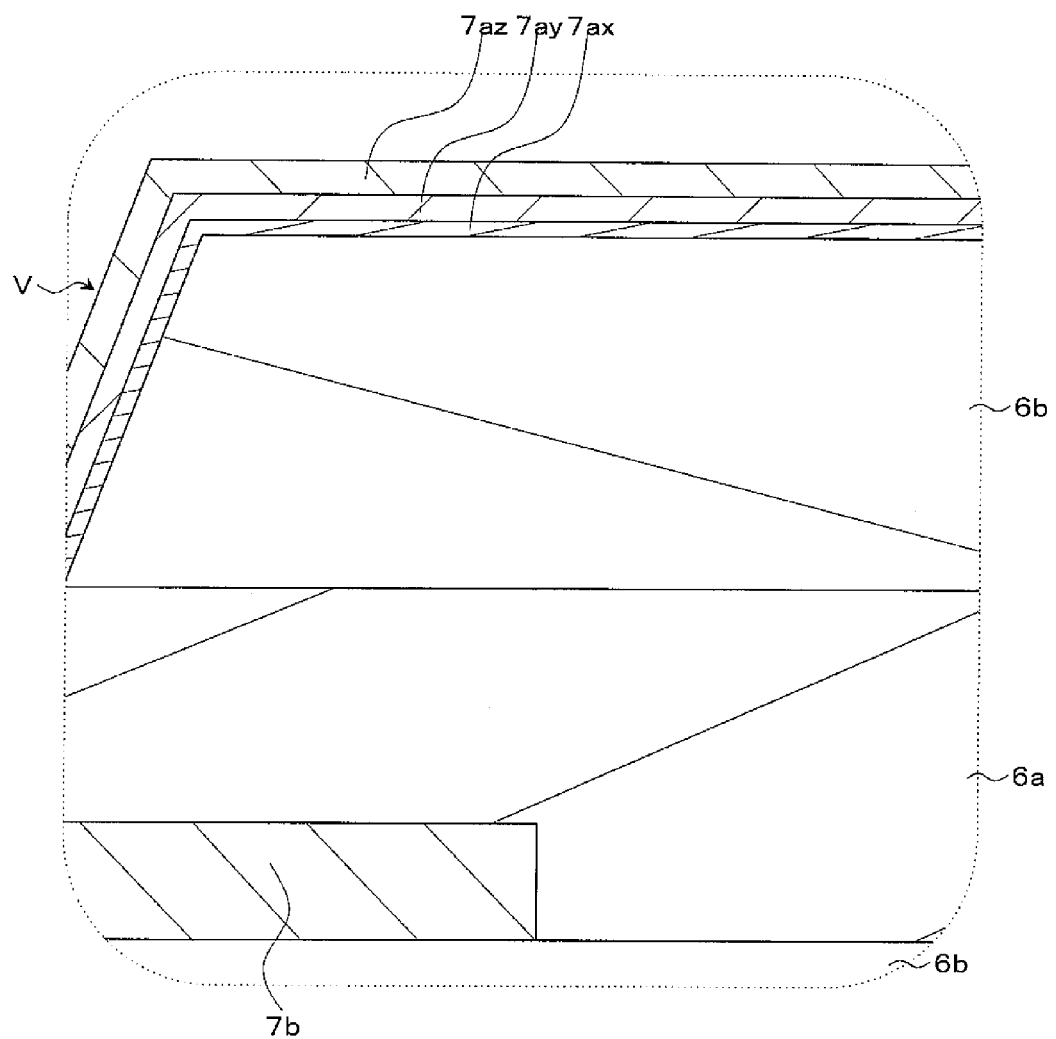
FIG. 10 is an enlarged view illustrating a step for manufacturing the mounting structure in the portion X1 of the mounting structure shown in FIG. 1.

(15) As shown in FIG. 10, the second metal is sputtered on the surfaces of the first metal layers 7ay to form the second metal layers 7az. By forming the second metal layers 7az, entering of oxygen into the first metal layers 7ay and the metal carbide layers 7ax can be decreased, thereby decreasing oxidation of the first metal carbide. As a result, the content of the first metal carbide in the metal carbide layers 7ax can be maintained, thereby maintaining adhesive force between the resin layers 6b and the metal carbide layers 7ax. In this case, during a series of the steps from step (13) to step (15), the vacuum condition in the deposition apparatus is preferably maintained. As a result, entering of oxygen into the first metal layers 7ay and the metal carbide layers 7ax can be decreased. The sputtering output of the second metal is preferably set to 500 W or more.

Figure 11:
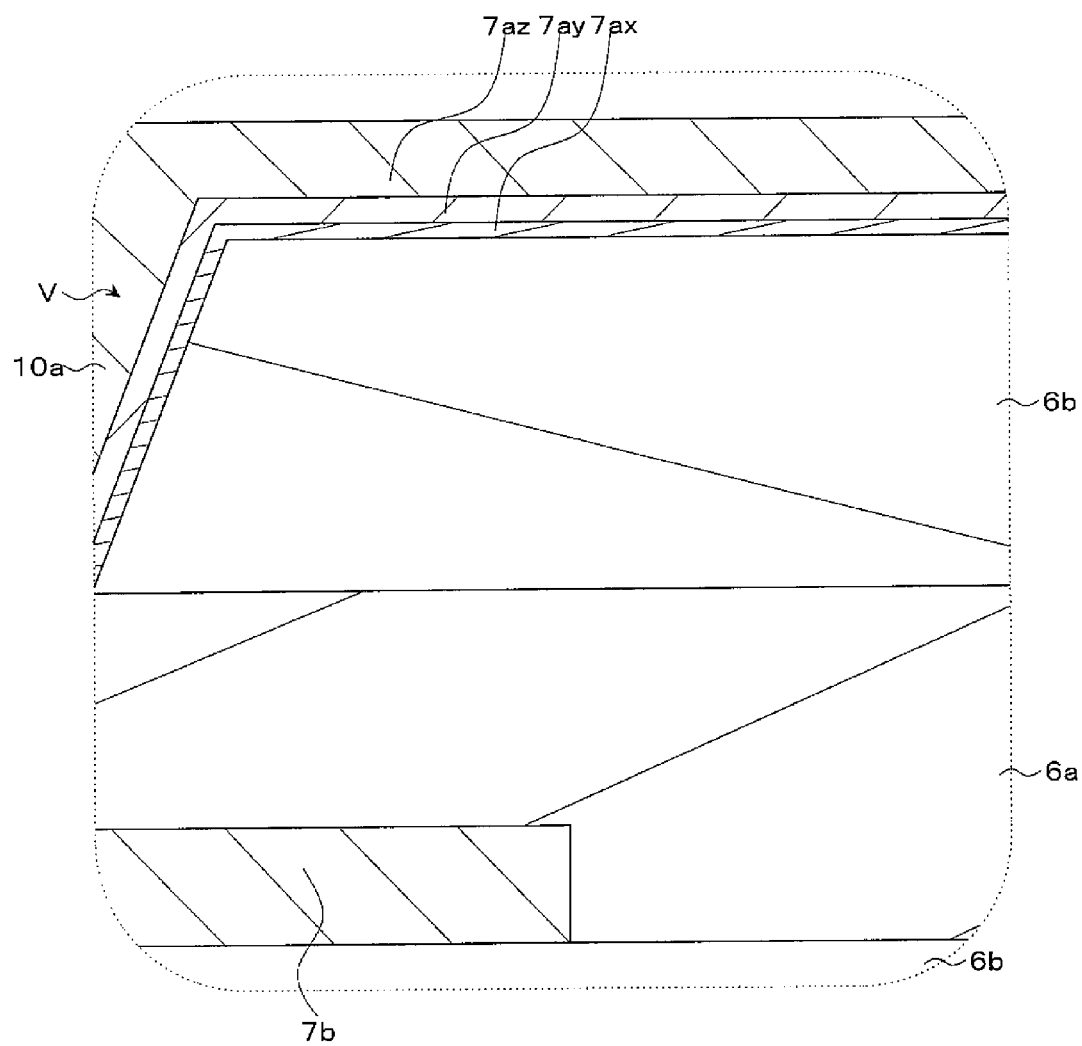
FIG. 11 is an enlarged view illustrating a step for manufacturing the mounting structure in the portion X1 of the mounting structure shown in FIG. 1.

(16) As shown in FIG. 11, the second metal is deposited on the surfaces of the second metal layers 7az by electroplating or the like. As a result, the thickness of the second metal layers 7az can be easily increased. In addition, the via holes V can be filled with the second metal layers 7az, and thus the first via conductors 10a can be easily formed.

Figure 12:
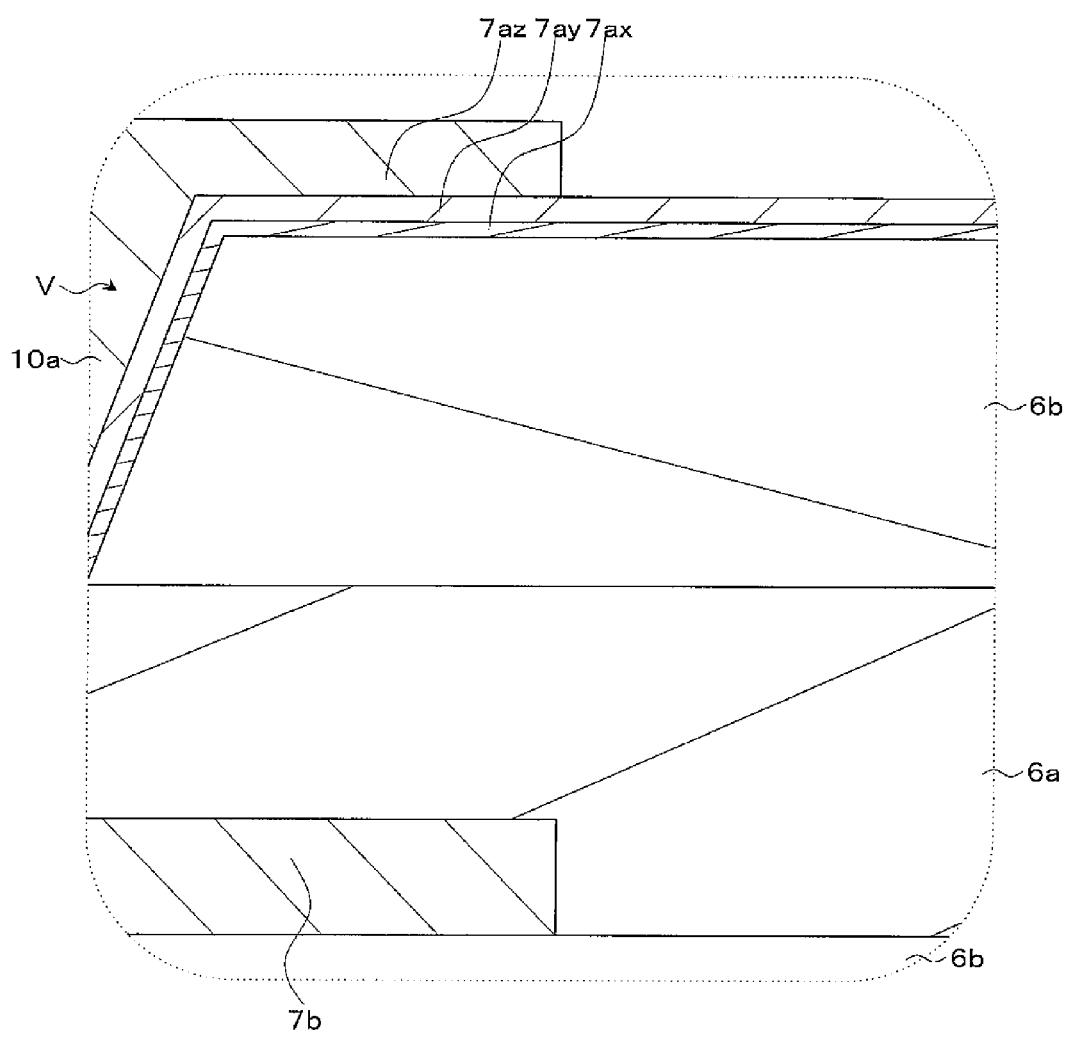
FIG. 12 is an enlarged view illustrating a step for manufacturing the mounting structure in the portion X1 of the mounting structure shown in FIG. 1.

(17) As shown in FIG. 12, the second metal layers 7az are patterned. The patterning is performed by photolithography, etching, or the like.

Figure 14A:
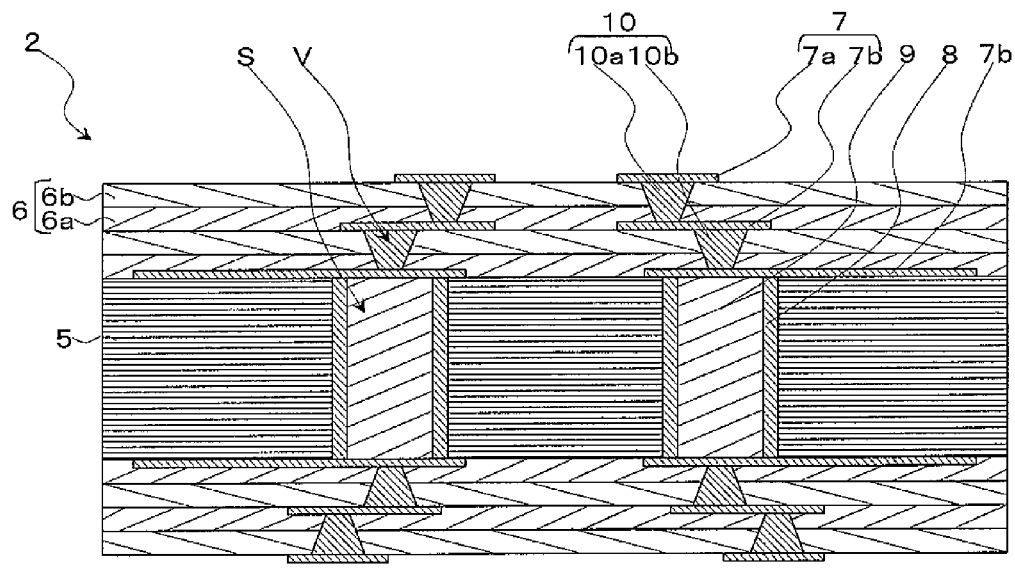
FIGS. 14A and 14B are sectional views illustrating respective steps for manufacturing the mounting structure shown in FIG. 1.

(18) As shown in FIG. 13, the first metal layers 7ay and the metal carbide layers 7ax are patterned. The patterning is performed by photolithography, etching, or the like. As a result, as shown in FIG. 14A, the first conductive layers 7a can be formed. The circuit board 2 can be manufactured as described above.

Figure 14B:
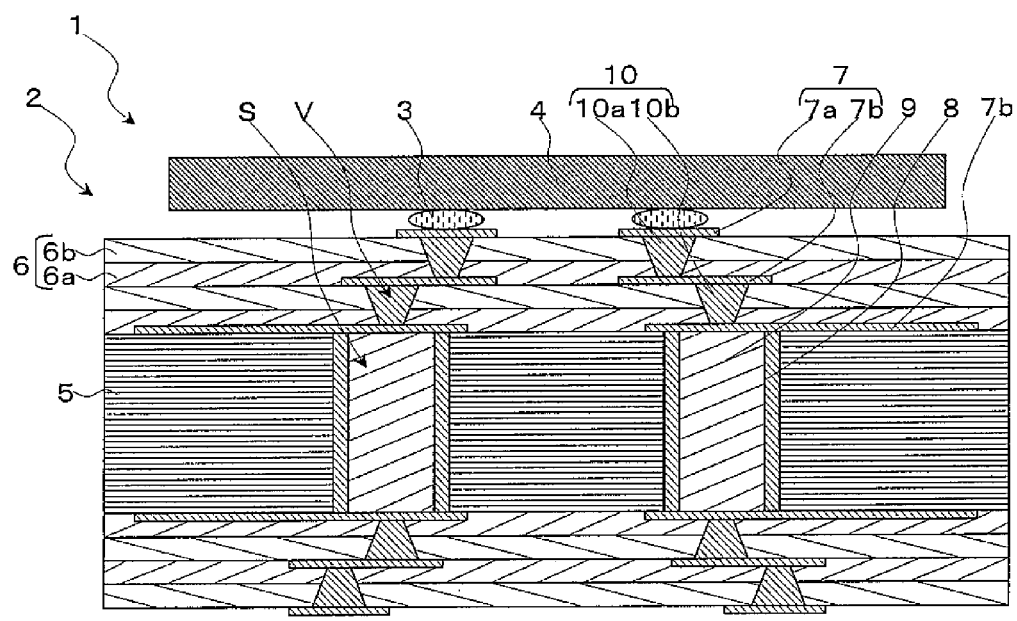

(19) As shown in FIG. 14B, the electronic component 4 is flip-chip mounted on the circuit board 2 through the bumps 3. As a result, the mounting structure 1 can be formed.

EXAMPLE

In this example, a circuit board was formed, and it was confirmed that a metal carbide is contained in a metal carbide layer of a first conductive layer.

First, a circuit board was formed by the above-described manufacturing method. In the step (12), the plasma was treated under an argon atmosphere in a chamber. A period of plasma treatment was 120 seconds. A pressure in the chamber was set to about from 10 Pa to 20 Pa. An electric power per unit area of electrodes was set to be 0.40 W/cm$^2$. A temperature in the chamber was set to be room temperature (about 25° C.). In the steps (13) and (14), a nickel-chromium alloy was sputtered on the surfaces of the second resin layers 6b composed of polyimidobenzoxazole resin with an output of 1200 W for a time of 120 seconds at a temperature of 130° C. In addition, copper sputtering was performed in the step (15), and electroplating of copper was performed in the step (16).

As described above, the circuit board including a metal carbide layer containing a chromium carbide, a first metal layer composed of a nickel-chromium alloy, and a second metal layer composed of copper was formed.

Next, a section of the circuit board taken along the vertical direction was observed with a transmission electron microscope. As a result, the thickness of the metal carbide layer was 20 nm, and the thickness of the first metal layer was 50 nm.

In addition, the first conductive layer of the circuit board was analyzed by Auger electron spectroscopy. Specifically, the analysis was performed as follows:

First, the second metal layer was removed by etching with an aqueous solution of sulfuric acid-hydrogen peroxide. Next, the first metal layer and the metal carbide layer were analyzed with PEI Model SAM-670 scanning Auger electron spectroscopy analyzer while being etched with argon ions.

The AES measurement conditions included an acceleration voltage of 3 kV, a sample voltage of 10 nA, a beam diameter of 100 nm or less, and a sample inclination angle of 72°. The ion etching conditions included ion species of $Ar^+$, an acceleration voltage of 2 kV, a sample inclination angle of 72°, and an etching rate (in terms of $SiO_2$) of 4.5 nm/min.

Figure 15:
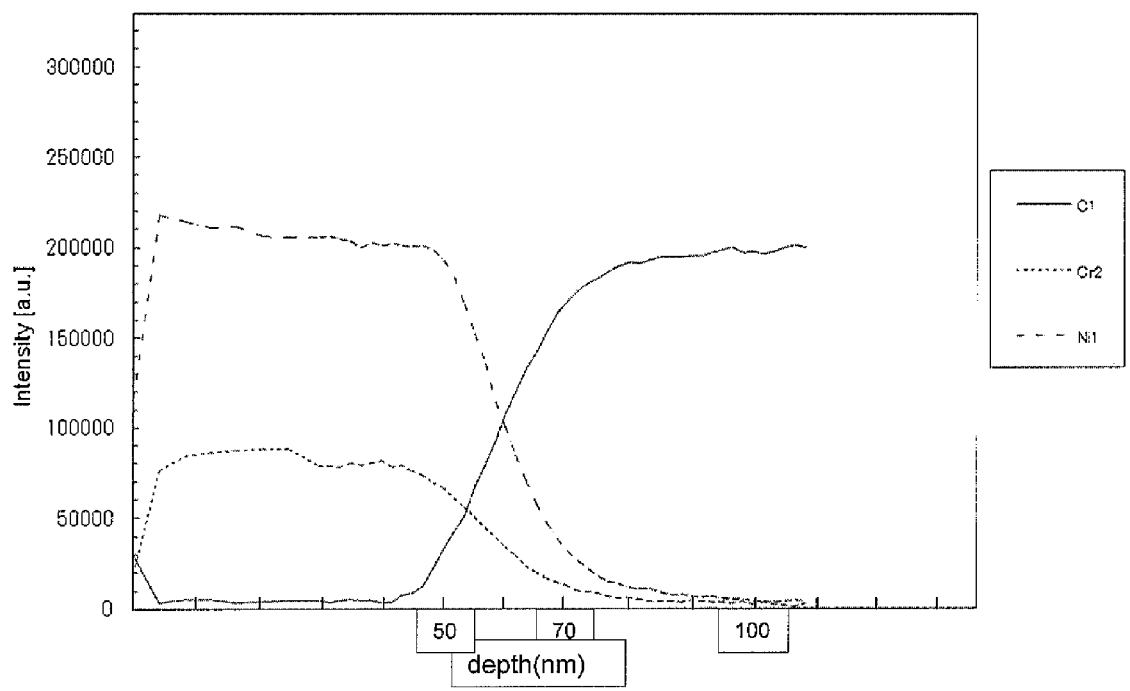
FIG. 15 is a graph showing the results of Auger analysis of a circuit board according to an embodiment of the present invention.
Figure 16:
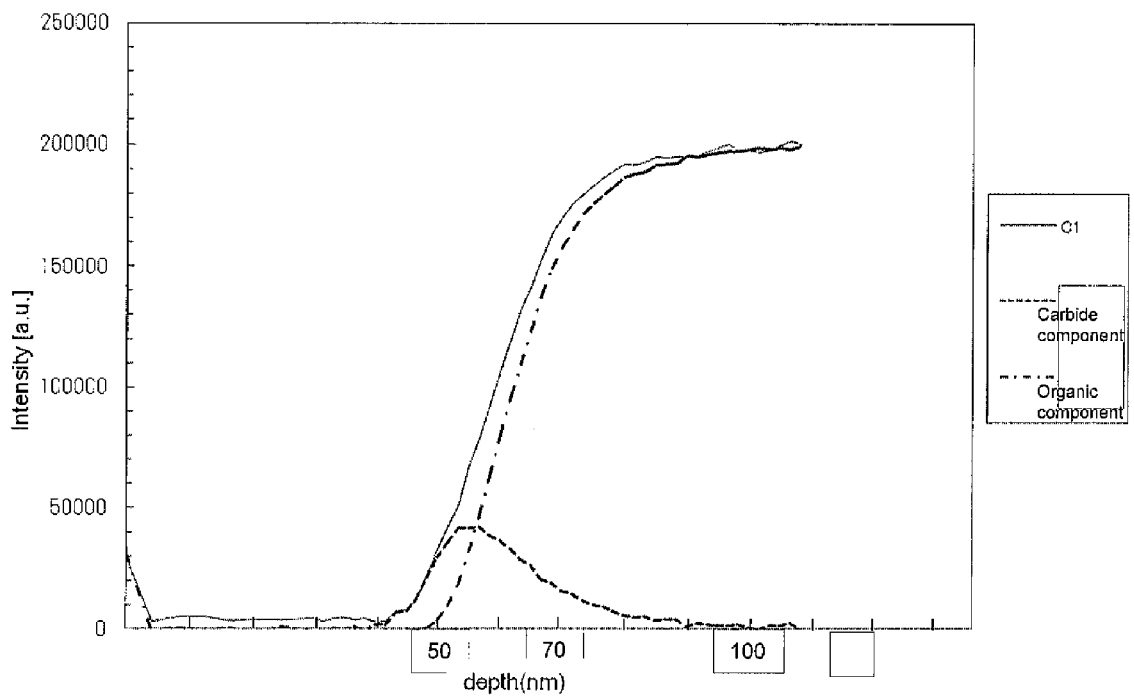
FIG. 16 is a graph showing separation of carbon components in the results shown in FIG. 15.

The analysis results are shown in FIGS. 15 and 16. FIG. 15 shows separation of an analysis sample into a nickel component, a chromium component, a copper component, a carbon component, and an oxygen component. In FIG. 15, the depth from the surface of the analysis sample is shown on the abscissa, and the relative abundance of each component is shown on the ordinate. In FIG. 15, a region from a depth of 4 nm to less than 50 nm from the surface of the analysis sample corresponds to the first metal layer, a region from a depth of 50 nm to less than 70 nm corresponds to the metal carbide layer, and a region from a depth of 70 nm or more corresponds to the resin layer.

FIG. 16 shows separation of the carbon component shown in FIG. 15 into an organic component constituting resin molecules and a carbide component constituting a metal carbide.

As shown in FIG. 15, in the metal carbide layer, the chromium component (first metal component) and nickel component decrease, and the carbon component increases as compared in the first metal layer. In addition, as the depth from the surface of the analysis sample increases, the chromium component and nickel component decrease, and the carbon component increases. As shown in FIG. 16, in the metal carbide layer, the carbide component increases as compared in the first metal layer and the resin layer, and the metal carbide layer contains a metal carbide. In addition, the first metal layer includes a mixed layer having a metal carbide content of 20 or more near the boundary (a region from a depth of 40 nm to less than 50 nm from the surface of the analysis sample) with the metal carbide layer.

Therefore, in the circuit board of this example, it was confirmed that the metal carbide layer contains a metal carbide.

The present invention is not limited to the above-described embodiment, and various modifications, improvements, and the like can be made within the scope of the gist of the present invention.

For example, in the above-described embodiment, a configuration in which each of the insulating layers formed on the upper and lower surfaces of the substrate 5 includes two layers is described as an example. However, each of the insulating layers 6 may include one layer or three or more layers. In addition, in the above-described embodiment, a configuration in which the electronic component 4 is flip-chip mounted on the upper surface of the circuit board 2 is described as an example. However, the electronic component 4 may be mounted on the upper surface of the circuit board 2 by wire bonding or may be embedded in the circuit board 2.

Figure 17:
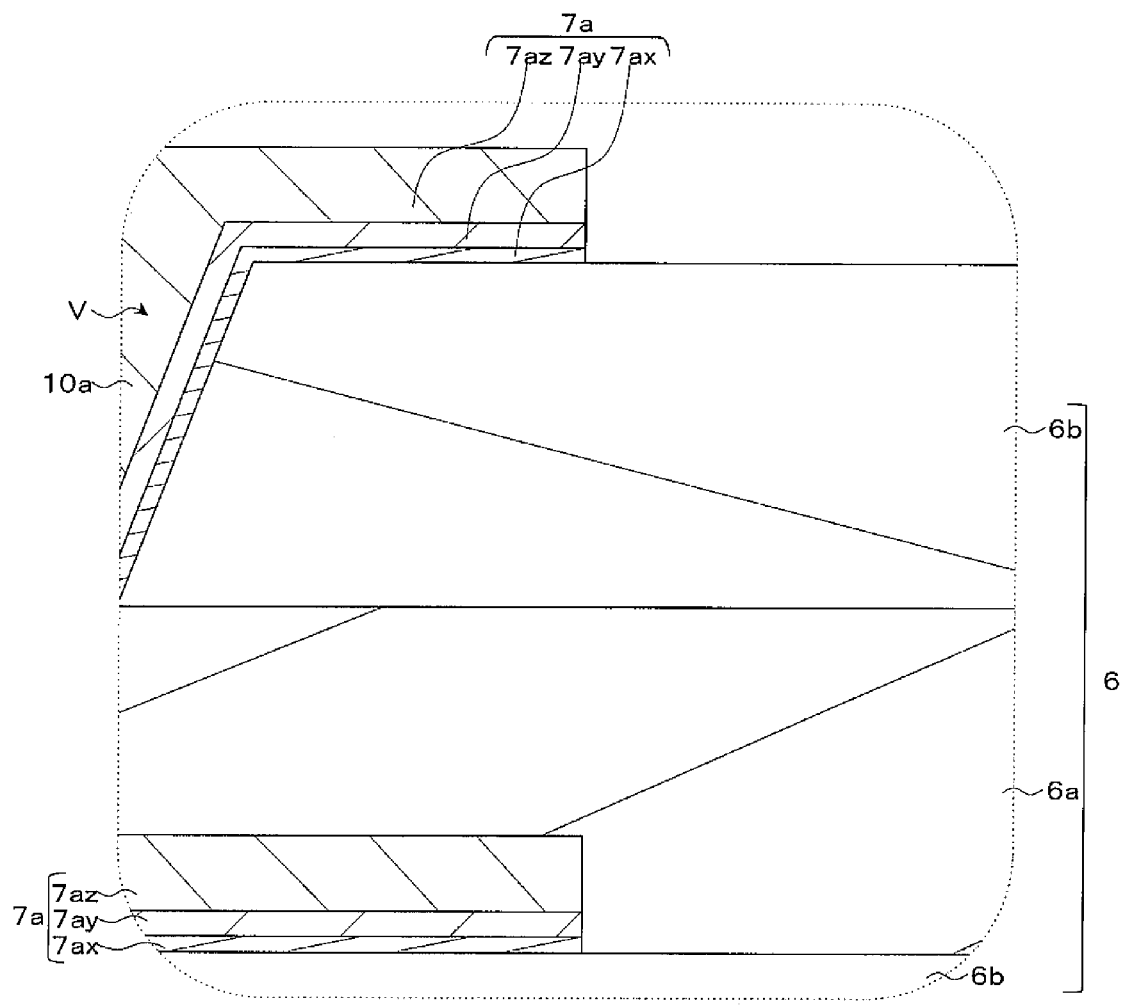
FIG. 17 is an enlarged view of a portion of a mounting structure according to an embodiment of the present invention, the portion corresponding to the portion X1 shown in FIG. 1.

Further, in the above-described embodiment, a configuration in which the first conductive layers 7a are formed only on the top insulating layer 6 is described as an example. However, as shown in FIG. 17, the first conductive layers 7a may be formed on the insulating layers 6 other than the top layer. In this case, adhesion between the insulating layers 6 other than the top layer and the conductive layers 7a can be enhanced.

Further, in the above-described embodiment, the manufacturing method in which the first conductive layers 7a are formed by a subtractive process for patterning using photolithography, etching, and the like is described as an example. However, the first conductive layers 7a may be formed by a semi-additive process, a full additive process, or the like.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit board comprising:
   an insulating layer comprising a resin; and
   a conductive layer disposed over the insulating layer, the conductive layer comprising
   a metal carbide layer being in contact with the insulating layer and comprising a metal carbide comprising a carbon and a first metal, wherein the first metal is chromium;
   a first metal layer being in contact with the metal carbide layer and comprising the first metal; and
   a second metal layer in contact with the first metal layer and comprising a second metal different from the first metal, the second metal being selected from the group consisting of copper, gold, silver, platinum and aluminum, wherein the second metal layer is connected to the metal carbide layer via the first metal layer.

2. The circuit board according to claim 1, wherein the resin has neither glass-transition temperature nor melting point.

3. The circuit board according to claim 1, further comprising:
   a plurality of insulating layers;
   wherein the conductive layer is on a top layer of the insulating layers.

4. A structure comprising:
   a circuit board according to claim 1; and
   an electronic device mounted over the circuit board and electrically connected to the conductive layer.

5. The circuit board according to claim 1, further comprising:
   a via conductor in a via hole in the insulating layer, the via conductor comprising:
   an extended portion of the metal carbide layer bonded to an inner wall of the via hole,
   an extended portion of the first metal layer bonded to the extended portion of the metal carbide layer,
   an extended portion of the second metal layer bonded to the extended portion of the first metal layer.

6. The circuit board according to claim 1, wherein a thickness of the first metal layer is larger than a thickness of the metal carbide layer.

\* \* \* \* \*